United States Patent
Kondo et al.

(10) Patent No.: US 9,941,854 B2
(45) Date of Patent: Apr. 10, 2018

(54) MUSIC REPRODUCING DEVICE

(71) Applicant: Onkyo Corporation, Osaka (JP)

(72) Inventors: Yusuke Kondo, Osaka (JP); Susumu Takemura, Osaka (JP)

(73) Assignee: Onkyo Corporation, Osaka (JP)

( * ) Notice: Subject to any disclaimer, the term of this patent is extended or adjusted under 35 U.S.C. 154(b) by 0 days.

(21) Appl. No.: 15/232,935

(22) Filed: Aug. 10, 2016

(65) Prior Publication Data

US 2017/0063319 A1    Mar. 2, 2017

(30) Foreign Application Priority Data

Sep. 1, 2015    (JP) ................... 2015-171796

(51) Int. Cl.
| | |
|---|---|
| *H03G 3/00* | (2006.01) |
| *H03G 3/30* | (2006.01) |
| *H04R 3/04* | (2006.01) |
| *H04R 5/04* | (2006.01) |

(52) U.S. Cl.
CPC ............ *H03G 3/3005* (2013.01); *H04R 3/04* (2013.01); *H04R 5/04* (2013.01); *H04R 2420/05* (2013.01)

(58) Field of Classification Search
CPC .......... H03G 3/0005; H04R 5/04; H04R 3/04; H04R 2420/05
See application file for complete search history.

(56) References Cited

U.S. PATENT DOCUMENTS

| | | |
|---|---|---|
| 2002/0118848 A1 | 8/2002 | Karpenstein |
| 2007/0053246 A1* | 3/2007 | Sano ....................... G11B 27/34 369/30.04 |
| 2008/0024341 A1* | 1/2008 | Inukai ................... H03F 3/2175 341/143 |
| 2008/0144860 A1* | 6/2008 | Haller ..................... H03G 3/10 381/109 |
| 2009/0276547 A1 | 11/2009 | Rosenblatt et al. |
| 2012/0207319 A1 | 8/2012 | Tsuchiya et al. |
| 2013/0058494 A1 | 3/2013 | Kim et al. |

(Continued)

FOREIGN PATENT DOCUMENTS

| | | |
|---|---|---|
| EP | 2 487 930 A1 | 8/2012 |
| JP | 61-127299 | 6/1986 |

(Continued)

*Primary Examiner* — Andrew L Sniezek
(74) *Attorney, Agent, or Firm* — Renner, Otto, Boisselle & Sklar, LLP

(57) ABSTRACT

A music reproducing device has a controller configured to perform volume control on audio data; a digital-to-analog (D/A) converter operatively coupled to the controller and configured to convert the audio data from digital audio data to analog audio data, and to perform volume control on the audio data; and a plurality of different types of audio outputs, including at least one headphone output for outputting the audio data from the D/A converter to one or more headphones; the controller and the D/A converter configured to perform different types of volume control on the audio data, the controller performing all volume control except the volume control related to only the at least one headphone output among the multiple volume control, and the D/A converter performing one or more types of volume control which relate only to the at least one headphone output.

10 Claims, 6 Drawing Sheets

(56) References Cited

U.S. PATENT DOCUMENTS

2013/0259241 A1* 10/2013 Schul .................... H04R 3/002
　　　　　　　　　　　　　　　　　　　　　　　　　381/56
2014/0010381 A1*  1/2014 Doy ...................... H04R 29/00
　　　　　　　　　　　　　　　　　　　　　　　　　381/59

FOREIGN PATENT DOCUMENTS

| JP | 3019801 | 10/1995 |
| JP | 11-238301 | 8/1999 |
| JP | 2003-204599 | 7/2003 |
| JP | 2014-222502 | 11/2014 |
| JP | 2014-529975 | 11/2014 |
| KR | 2003-0016199 A | 2/2003 |

* cited by examiner

Fig. 6

| | | | Volume Processing | LR Balance Processing | Gain Control | Europe Sound Pressure Regulation | Volume Maximum Setting | Auto Volume |
|---|---|---|---|---|---|---|---|---|
| High Resolution Headphone Output | Unbalanced | Headphone | O | O | O | O | O | X |
| | | Line Out | X | X | X | X | X | X |
| | Balanced | Headphone | O | O | O | O | O | O |
| | | Line Out | X | X | X | X | X | X |
| Standard Headphone Output | Unbalanced | Headphone | O | O | O | O | O | X |
| | | Line Out | X | X | X | X | X | X |
| | Balanced | Headphone | O | O | O | O | O | O |
| | | Line Out | X | X | X | X | X | X |
| USB | | | O | O | X | X | O | X |
| BT | | | O | O | X | X | O | X |
| Speaker | | | O | O | X | X | O | X |
| Wi-Fi | | | O | O | X | X | O | X |

MUSIC REPRODUCING DEVICE

BACKGROUND OF THE INVENTION

1. Field of the Invention

The present invention relates to a music reproducing device that outputs an audio signal.

2. Description of the Related Art

In a music reproducing device that outputs an audio signal, there is a music reproducing device that has multiple outputs (for example, see JP 2014-222502 A). For example, the music reproducing device has a headphone output of a balanced system, a headphone output of an unbalanced system, a Wi-Fi output according to Wi-Fi standard, a Bluetooth (registered trademark) output according to Bluetooth standard, a USB output according to USB audio class, and a speaker output.

Further, in the music reproducing device, there is a music reproducing device that has multiple volume control. For example, the music reproducing device has volume maximum setting that limits volume to maximum that is received, LR balance processing that adjusts volume balance of L channel and R channel, auto volume adjustment that adjusts volume at timing of switching mode, gain control that adjusts gain based on impedance of a headphone, and Europe sound pressure limit that limits volume to maximum that is defined in Europe sound pressure limit.

In the music reproducing device that has multiple outputs and multiple volume control, the volume control that is performed is different based on an output. Therefore, it is need that appropriate volume control is performed based on the output.

SUMMARY OF THE INVENTION

An objective of the present invention is to provide a music reproducing device that can perform appropriate volume control based on an output.

A music reproducing device having multiple volume control comprising: a D/A converter that converts a digital audio signal into an analog audio signal; and a controller, wherein the D/A converter that has volume adjusting function nearest from a headphone output performs volume control related to only a headphone.

For example, as volume control related to only a headphone, there is sound pressure limit in Europe. The volume control related to only the headphone does not need to be performed at a speaker output and so on other than a headphone output. For this reason, in the present invention, a D/A converter that has volume adjusting function nearest from the headphone output performs the volume control related to only the headphone. Thus, according to the present invention, appropriate volume control is performed based on an output.

Preferably, wherein the controller performs the volume control except the volume control related to only the headphone among the multiple volume control.

In the present invention, the controller performs the volume control except the volume control related to only the headphone among multiple volume control. Thus, the volume control except the volume control related to only the headphone is performed to multiple outputs including the headphone output.

Preferably, wherein the volume control related to only the headphone is gain control that controls gain based on impedance of the headphone.

Preferably, wherein the volume control related to only the headphone is sound pressure regulation that limits volume to predetermined sound pressure level.

Preferably, wherein volume control except the volume control related to only the headphone is volume processing that adjusts volume that is received.

Preferably, wherein the volume control except the volume control related to only the headphone is volume maximum setting that limits volume to maximum that is received.

Preferably, wherein the volume control except the volume control related to only the headphone is LR balance processing that adjusts volume balance of L channel and R channel.

Preferably, the music reproducing device having a balanced mode and an active control ground mode that amplifies the analog audio signal by one amplifier and maintains ground by the other amplifier of two amplifiers; wherein the volume control except the volume control related to only the headphone is auto volume adjustment that adjusts volume automatically at timing of switching from one mode to the other mode.

Preferably, wherein the volume control related to only the headphone is gain control that controls gain based on impedance of the headphone, and is sound pressure regulation that limits volume to predetermined sound pressure level, the volume control except the volume control related to only the headphone is volume processing that adjusts volume that is received, is volume maximum setting that limits to volume that is received, and is LR balance processing that adjusts volume balance of L channel and R channel, the music reproducing device having a balanced mode and an active control ground mode that amplifies the analog audio signal by one amplifier and maintains ground by the other amplifier of two amplifiers, the volume control except the volume control related to only the headphone is auto volume adjustment that adjusts volume automatically at timing of switching from one mode to the other mode.

Preferably, wherein an audio signal that all volume control is performed is output to the headphone of a balanced system.

Preferably, wherein an audio signal that the volume control other than the auto volume adjustment is performed is output to the headphone of an unbalanced system.

Preferably, wherein au audio signal that the volume processing, the LR balance processing, and the volume maximum setting are performed is output to a device other than the headphone.

Preferably, wherein an audio signal that all volume control is not performed is output to a line out output.

According to the present invention, appropriate volume control is performed based on an output.

BRIEF DESCRIPTION OF THE DRAWINGS

FIG. 6 is a table illustrating volume control that is performed against the input and the output.

DETAILED DESCRIPTION OF THE PREFERRED EMBODIMENTS

Figure 1:
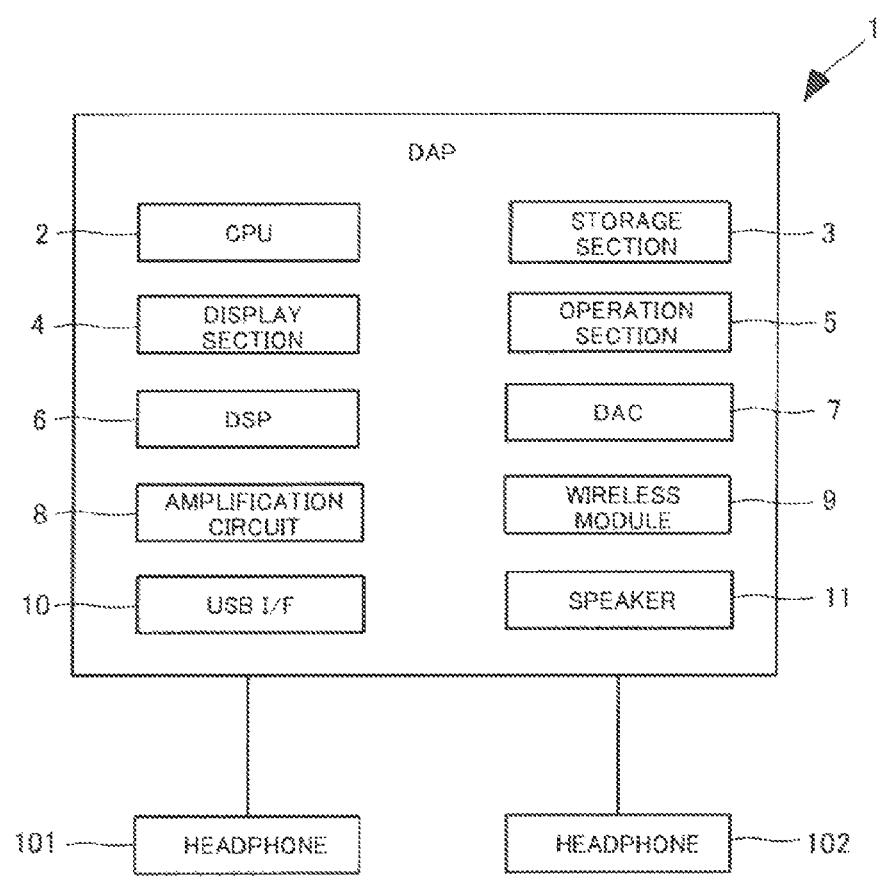
FIG. 1 is a block diagram illustrating a constitution of a digital audio player according to an embodiment of the present invention.

An embodiment of the present invention is described below. FIG. 1 is a block diagram illustrating a constitution of a digital audio player (hereinafter, referred as to "DAP") according to an embodiment of the present invention. A DAP 1 (music reproducing device) outputs analog audio data (analog audio signal) to a speaker 11 and headphones 101 and 102. Each of the speaker 11 and the headphones 101 and 102 outputs an audio based on the analog audio data. The headphone 101 is for balanced and is connected to a balanced output terminal. The headphone 102 is for unbalanced and is connected to an unbalanced output terminal. The DAP 1 has a balanced output and an unbalanced output.

As illustrated in FIG. 1, the DAP 1 includes a CPU 2, a storage section 3, a display section 4, an operation section 5, a DSP 6, a D/A converter (hereinafter, referred as to "DAC") 7, an amplification circuit 8, a wireless module 9, a USB interface (hereinafter, referred as to "USB I/F") 10, and the speaker 11.

The CPU (Central Processing Unit) 2 (controller) controls respective sections composing the DAP 1 according to a control program, an OS program or application programs. The storage section 3 is composed of a RAM (Random Access Memory) that functions as a main memory of the CPU 2, a ROM (Read Only Memory) for storing the control program and a flash memory for storing programs such as the OS program and the application programs, and various data such as digital audio data. The storage section 3 is not limited to the illustrated constitution, and may include an HDD (Hard Disk Drive).

The display section 4 displays various images (including pictures and movies), and is composed of a liquid crystal panel. The operation section 5 has operation keys for performing various settings, and a touch panel that is linked with the display section 4. A user can input various characters and perform setting via the operation section 5.

The DSP (Digital Signal Processor) 6 performs signal processing such as equalizing to the digital audio data. The DAC 7 (D/A converter) D/A-converts the digital audio data (digital audio signal) into the analog audio data (analog audio signal). The amplification circuit 8 amplifies the analog audio data that the DAC 7 D/A-converts and outputs the amplified analog audio data to the headphone 101 or the headphone 102. The wireless module 9 is for performing wireless communication according to Bluetooth (registered trademark) standard and Wi-Fi standard. The USB I/F 10 is for performing communication according to USB standard.

Figure 2:
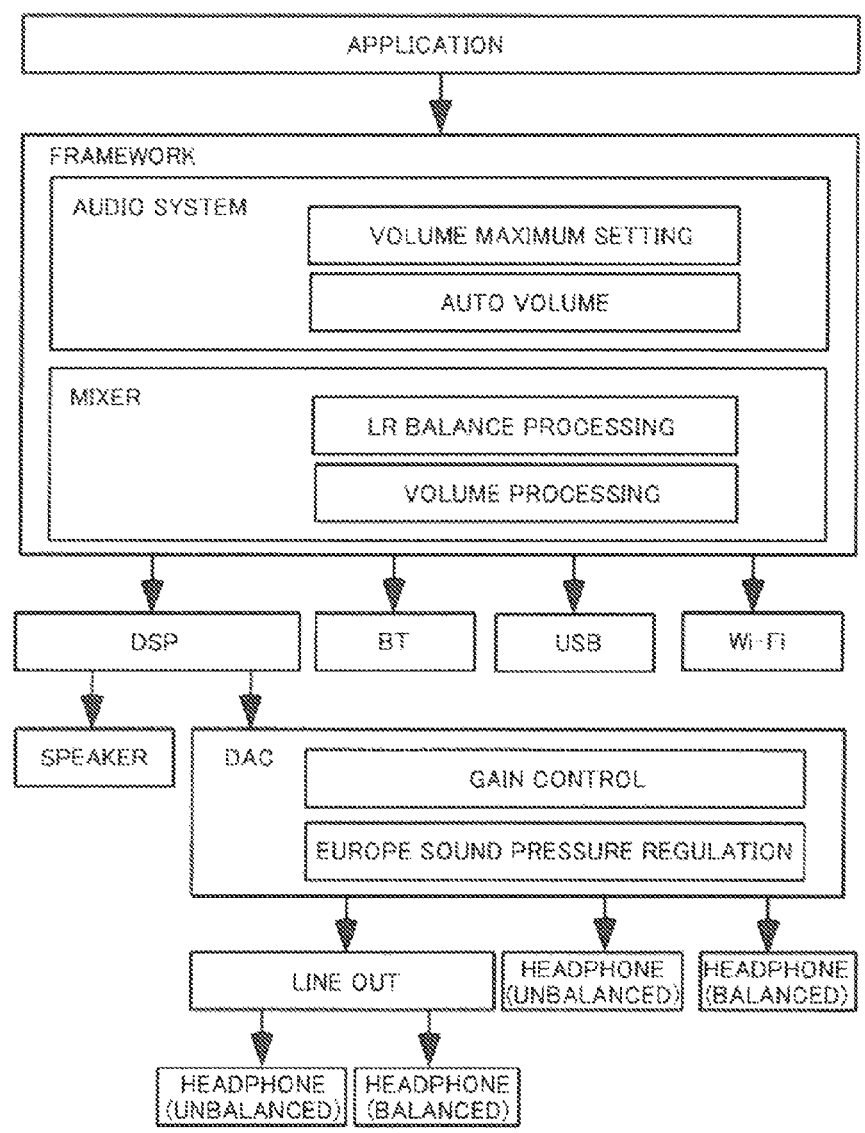
FIG. 2 is a diagram illustrating flow of audio data in the digital audio player.

The DAP 1 mounts Android (registered trademark) OS. In reproducing music, the CPU 2 performs music reproducing according to Audio Framework (framework) that is provided by Android (registered trademark) basically. FIG. 2 is a diagram illustrating flow of the audio data in the DAP 1. First, the digital audio data is output from an application to a framework. An audio system and a mixer are included in the framework. The audio system is a module that performs setting related to an input and an output of the digital audio data. The mixer is a module that connects multiple tracks and applies attenuation of volume and effect. The CPU 2 performs processing according to the audio system and the mixer.

The digital audio data is output to the DSP 6, the wireless module 9 ("BT" and "Wi-Fi" in FIG. 2), and the USB I/F 10. In "BT" of FIG. 2, the digital audio data is output to an external device according to Bluetooth (registered trademark) standards. In "USB", the digital audio data is output to the external device according to USB standard (USB audio class). In "Wi-Fi", the digital audio data is output to the external device according to Wi-Fi standard.

The DSP 6 decodes the digital audio data and outputs the decoded digital audio data to the speaker 11 and the DAC 7. The DAC 7 D/A-converts the digital audio data into the analog audio data and outputs the analog audio data to a line out output terminal (line out), an unbalanced output terminal (headphone (unbalanced)), and a balanced output terminal (headphone (balanced)). The DAC 7 has volume adjusting function.

The DAP 1 has multiple volume control including volume maximum setting, auto volume, LR balance processing, volume processing, gain control, and Europe sound pressure regulation. Each volume control is described below.

(Volume Processing)

Figure 3:
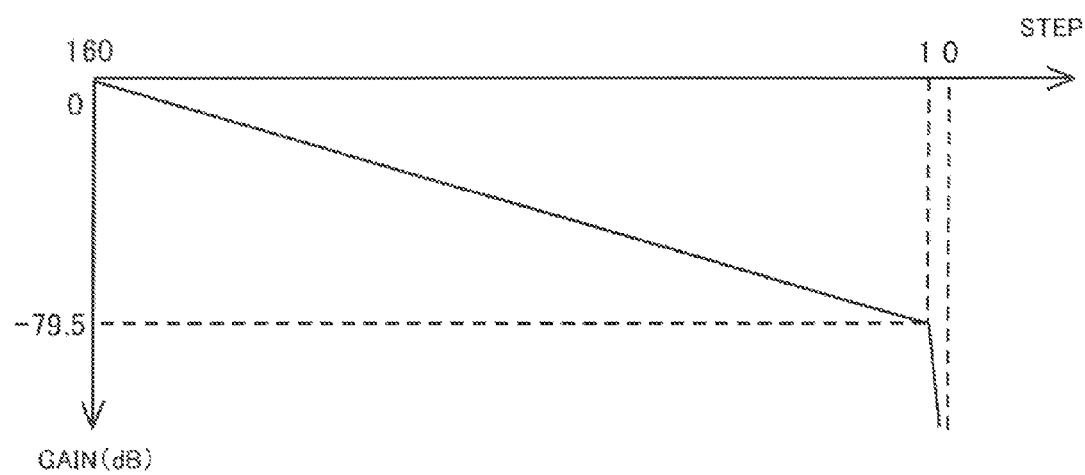
FIG. 3 is a diagram for describing volume processing.

FIG. 3 is a diagram illustrating change of volume in the DAP 1. Volume step of the DAP 1 is 161 steps from 0 to 160. In FIG. 3, a horizontal axis illustrates number of steps. A vertical axis illustrates gain (dB). Step 160 is 0 dB. Attenuation of volume per one step dropping is 0.5 dB. Step 1 is −79.5 dB. Step 0 is minus infinity, namely, mute status. The CPU 2 receives instruction of volume adjustment by user interface (UI) that the CPU 2 illustrates at the display section 4 from a user. Then, the CPU 2 adjusts volume that is received.

(Volume Maximum Setting)

The user can set maximum step of volume that is output from the DAP 1. The CPU 2 receives instruction of maximum step by user interface (UI) that the CPU 2 illustrates at the display section 4 from the user. Then, the CPU 2 limits volume to maximum that is received.

(LR Balance Processing)

Figure 4:
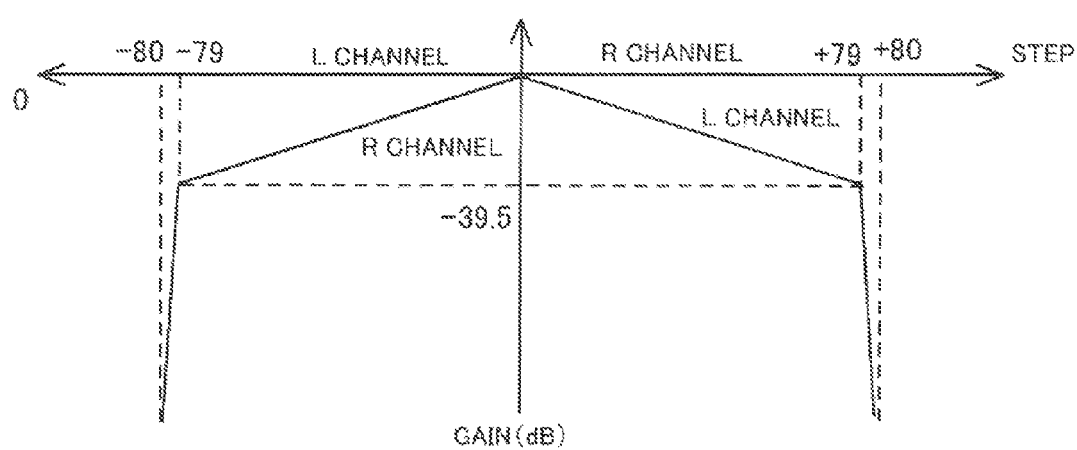
FIG. 4 is a diagram for describing LR balance processing.

The user can adjust volume of L channel and R channel. The CPU 2 receives instruction of volume adjustment of L channel and R channel by user interface (UI) that the CPU 2 illustrates at the display section 4 from the user. As illustrated in FIG. 4, the CPU 2 attenuates received step from main volume. Thus, the CPU 2 adjusts volume balance of L channel and R channel.

(Auto Volume (Auto Volume Adjustment))

The DAP 1 has an Active Control Ground (hereinafter referred as to "ACG") mode that amplifies the analog audio data by one amplifier of two amplifiers that the amplification circuit 8 includes and maintains ground by the other amplifier. Volume of the balanced mode is twice volume of the ACG mode. In the auto volume, the CPU 2 decreases volume with 6 dB compared with the ACG mode in the balanced mode. Namely, the CPU 2 adjusts volume automatically at timing switching from one mode to the other mode. The CPU 2 decreases volume with 6 dB at timing switching from the ACG mode to the balanced mode. Further, the CPU 2 increases volume with 6 dB at timing switching from the balanced mode to the ACG mode.

(Gain Control)

Impedance is different depending on a headphone (balanced or unbalanced). For this reason, a user can set suitable gain depending on impedance of the headphone. For example, the user can set "high (0 dB)," "normal (−6 dB)", or "low (−12 dB)". The DAC 7 attenuates value that is received by the CPU 2. Thus, the DAC 7 controls gain based on impedance of the headphone.

(Europe Sound Pressure Regulation)

In Europe, sound pressure regulation is obligated in a product. In the sound pressure regulation, sound pressure level that can be output under defined condition is defined.

The DAC 7 limits volume to sound pressure level that is defined in Europe sound pressure regulation.

The volume maximum setting and the auto volume are included in the audio system. Therefore, the CPU 2 performs the volume maximum setting and the auto volume according to the audio system. Further, the LR balance processing and the volume processing are included in the mixer. Therefore, the CPU 2 performs the LR balance processing and the volume processing according to the mixer. Further, the DAC 7 performs the gain control and Europe sound pressure regulation.

Figure 5:
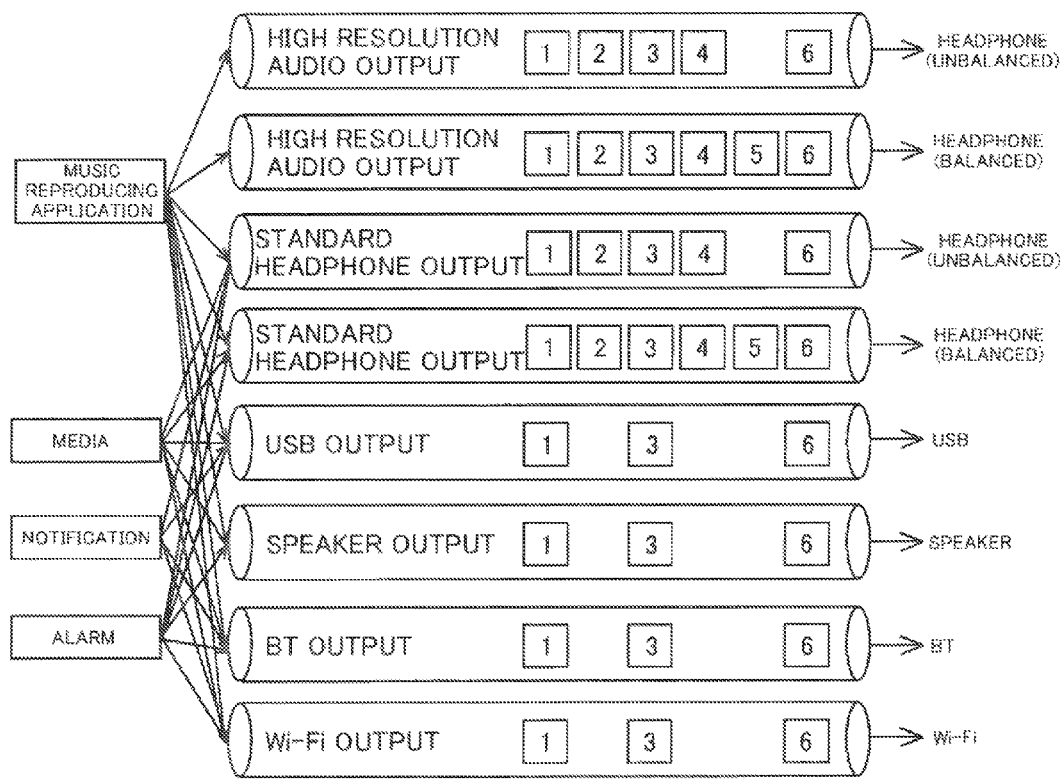
FIG. 5 is a diagram illustrating volume control that is performed against an input and an output.

FIG. 5 is a diagram illustrating the volume control that is performed against an input and an output. "Music reproducing application" illustrates the digital audio data from a music reproducing application. "Media" illustrates the digital audio data from applications other than the music reproducing application. "Notification" is the digital audio data for notification (incoming). "Alarm" is the digital audio data for alarm.

"High resolution audio output" is a route that is output to the headphone (balanced or unbalance) via a dedicated API. "Standard headphone output" is a route that is output to the headphone (balanced or unbalanced) via standard Android (registered trademark) API. "USB output" is a route that is output to a USB audio device via the standard API. "Speaker output" is a route that is output to the speaker 11 via the standard API. "BT output" is a route that is output to an external device corresponding to Bluetooth (registered trademark) standard via the standard API. "Wi-Fi output" is a route that is output to an external device corresponding to Wi-Fi standard. Thus, the DAP 1 has multiple outputs.

The digital audio data from the music reproducing application is input to all routes. The digital audio data from applications other than the music reproducing application and the digital audio data for notification and alarm are input to routes of the standard headphone output, the USB output, the speaker output, the BT output, and the Wi-Fi output. Volume control that is performed in each route is illustrated by number. "One (1)" illustrates the LR balance processing. "Two (2)" illustrates the gain control. "Three (3)" illustrates the volume maximum setting. "Four (4)" illustrates Europe sound pressure regulation. "Five (5)" illustrates the auto volume. "Six (6)" illustrates the volume processing.

In a route that is output to an unbalanced headphone of the high resolution audio output, the balance processing, the gain control, the volume maximum setting, Europe sound pressure regulation, and the volume processing are performed. In a route that is output to a balanced headphone of the high resolution audio output, the balance processing, the gain control, the volume maximum setting, Europe sound pressure regulation, the auto volume, and the volume processing are performed. In a route that is output to the unbalanced headphone of the standard headphone output, the balance processing, the gain control, the volume maximum setting, Europe sound pressure regulation, and the volume processing are performed. In a route that is output to the balanced headphone of the standard headphone output, the balance processing, the gain control, the volume maximum setting, Europe sound pressure regulation, the auto volume, and the volume processing are performed.

In the USB output, the speaker output, the BT output and the Wi-Fi output, the LR balance processing, the volume maximum setting, and the volume processing are performed.

FIG. 6 is a table illustrating the volume control that is performed against input and output. "O" illustrates the volume control that is performed. "X" illustrates the volume control that is not performed. As illustrated in FIG. 6, in the line out output, all volume control is not performed. Namely, in the line out output, volume is max (0 dB).

As illustrated in FIG. 5 and FIG. 6, each of the gain control and Europe sound pressure regulation is the volume control that only relates to the headphones 101 and 102. As illustrated in FIG. 2, the gain control and Europe sound pressure regulation that is the volume control related to only the headphones 101 and 102 are performed by the DAC 7 that has volume adjusting function nearest from the headphone output.

Further, as illustrated in FIG. 5 and FIG. 6, each of the volume processing, the volume maximum setting, the LR balance processing, and the auto volume is the volume control except the volume control related to only the headphones 101 and 102. The Volume control except the volume control related to only the headphones 101 and 102 is performed by the CPU 2.

As illustrated in FIG. 5 and FIG. 6, the analog audio data that all volume control is performed is output to the headphone 101 of a balanced system. Further, as illustrated in FIG. 5 and FIG. 6, the analog audio data that volume control other than the auto volume is performed is output to the headphone 102 of an unbalanced system. The audio data that the volume processing, the LR balance processing, and the volume maximum setting are performed is output to the external device corresponding to the USB standard, the external device corresponding to the Bluetooth (registered trademark) standard, and the external device corresponding to Wi-Fi standard other than the headphones 101 and 102.

For example, there is sound pressure regulation in Europe as the volume control related to only the headphones 101 and 102. The volume control related to only the headphones 101 and 102 is not necessary to be performed to the speaker output or the like other than the headphone output. For this reason, in the present embodiment, the DAC 7 that has volume adjusting function nearest from the headphone output performs volume control related to only the headphones 101 and 102. Thus, according to the present embodiment, appropriate volume control is performed based on the output.

Further, in the present embodiment, the CPU 2 performs the volume control except the volume control related to only the headphones 101 and 102 among multiple volume control. Thus, the volume control except the volume control related to only the headphones 101 and 102 is performed to multiple outputs including the headphone output.

The embodiment of the present invention is described above, but the mode to which the present invention is applicable is not limited to the above embodiment and can be suitably varied without departing from the scope of the present invention.

The above embodiment describes the DAP as a music reproducing device. Not limited to this, the music reproducing may be a smartphone, a tablet PC, a USB DAC.

The present invention can be suitably employed in a music reproducing device that outputs an audio signal.

What is claimed is:

1. A music reproducing device having multiple volume control comprising:
   a controller configured to perform volume control on audio data;
   a digital-to-analog (D/A) converter arranged within the music reproducing device, the D/A converter electrically coupled to the controller and configured to convert the audio data from digital audio data to analog audio data, and to perform volume control on the audio data on which the controller performed volume control; and a plurality of different types of audio outputs, including at least one headphone output for outputting the audio data from the D/A converter to one or more headphones, wherein the controller and the D/A converter are configured to perform different types of volume control on the audio data, the controller being configured to perform one or more types of volume control which relate to each of the plurality of different types of audio outputs, and the D/A converter being configured to perform one or more types of volume control which relate exclusively to the at least one headphone output for outputting the audio data from the D/A converter to the one or more headphones, and wherein the controller is configured to perform all of the different types of volume control on the audio data except the type or types of volume control related exclusively to the at least one headphone output among the multiple volume control and instead performed by the D/A converter.

2. The music reproducing device according to claim 1, wherein the volume control related exclusively to the at least one headphone output is gain control that controls gain based on impedance of the one or more headphones.

3. The music reproducing device according to claim 1, wherein the volume control related exclusively to the at least one headphone output is sound pressure regulation that limits volume to predetermined sound pressure level.

4. The music reproducing device according to claim 1, wherein the volume control except the volume control related exclusively to the at least one headphone output is volume processing by the controller that adjusts volume of the audio data that is received by the music reproducing device.

5. The music reproducing device according to claim 1, wherein the volume control except the volume control related exclusively to the at least one headphone output is volume maximum setting that limits volume of the audio data by the controller to maximum that is received.

6. The music reproducing device according to claim 1, wherein the volume control except the volume control related exclusively to the at least one headphone output is left-right (LR) balance processing that adjusts volume balance of left (L) channel and right (R) channel by the controller.

7. The music reproducing device according to claim 1, wherein the volume control related exclusively to the at least one headphone output is gain control that controls gain based on impedance of the one or more headphones, and is sound pressure regulation that limits volume to predetermined sound pressure level, the volume control except the volume control related exclusively to the at least one headphone output is volume processing by the controller that adjusts volume of the audio data that is received by the music reproducing device, is volume maximum setting that limits to volume of the audio data by the controller to maximum that is received, and is left-right (LR) balance processing that adjusts volume balance of left (L) channel and right (R) channel by the controller.

8. The music reproducing device according to claim 7, wherein an audio signal on which volume control is performed by both the controller and the D/A converter is output to the one or more headphones of a balanced system.

9. The music reproducing device according to claim 7, wherein an audio signal on which the volume processing, the LR balance processing, and the volume maximum setting are performed by the controller is output to a device other than the one or more headphones.

10. The music reproducing device according to claim 7, wherein an audio signal on which all volume control is not performed is output to a line out output.

* * * * *